United States Patent
Akimoto et al.

(10) Patent No.: US 9,880,206 B2
(45) Date of Patent: Jan. 30, 2018

(54) ELECTRIC CURRENT SENSOR

(71) Applicant: Hitachi Metals, Ltd., Tokyo (JP)

(72) Inventors: Katsuya Akimoto, Hitachi (JP); Hisashi Tate, Hitachi (JP); Naoki Futakuchi, Hitachinaka (JP); Naofumi Chiwata, Mito (JP); Ken Okuyama, Hitachi (JP); Yukio Ikeda, Hitachi (JP); Kazuhisa Takahashi, Hitachi (JP)

(73) Assignee: HITACHI METALS, LTD., Tokyo (JP)

(*) Notice: Subject to any disclaimer, the term of this patent is extended or adjusted under 35 U.S.C. 154(b) by 459 days.

(21) Appl. No.: 14/600,784

(22) Filed: Jan. 20, 2015

(65) Prior Publication Data
US 2015/0204916 A1 Jul. 23, 2015

(30) Foreign Application Priority Data
Jan. 21, 2014 (JP) .................. 2014-008776

(51) Int. Cl.
*G01R 19/00* (2006.01)
*G01R 33/09* (2006.01)
(Continued)

(52) U.S. Cl.
CPC ....... *G01R 19/0092* (2013.01); *G01R 15/207* (2013.01); *G01R 19/25* (2013.01); *G01R 33/093* (2013.01); *G01R 15/205* (2013.01)

(58) Field of Classification Search
CPC ................ G01R 15/205; G01R 15/207; G01R 19/0092; G01R 19/25; G01R 33/093
(Continued)

(56) References Cited

U.S. PATENT DOCUMENTS 6,512,359 B1  1/2003  Tamai et al.
7,084,617 B2 * 8/2006  Ozaki ................ G01R 15/202
                                              324/117 H
(Continued)

FOREIGN PATENT DOCUMENTS

DE  29804737 U1  5/1998
JP  H08-136587 A  5/1996
(Continued)

OTHER PUBLICATIONS

Office Action issued in the corresponding Japanese Application No. 2014-008776 dated Jan. 31, 2017.
Extended European Search Report dated Jul. 9, 2015.

*Primary Examiner* — John H Le
(74) *Attorney, Agent, or Firm* — Roberts Mlotkowski Safran Cole & Calderon P.C.

(57) ABSTRACT

An electric current sensor includes a plurality of bus bars arranged in parallel, a plurality of magnetic detection elements that are adapted to detect a strength of a magnetic field generated by an electric current flowing through the bus bars and to output a voltage according to the strength of the magnetic field detected, and an arithmetic operation part to arithmetically operate an electric current flowing through the bus bars based on the voltage output from the plurality of magnetic detection elements. The arithmetic operation part includes a magnetic flux density arithmetic operation part to arithmetically operate a magnetic flux density based on the voltage, and an electric current arithmetic operation part to arithmetically operate an electric current $I_1$ to $I_m$ flowing through each of the bus bars based on formula (1) below, (Continued)

$$\begin{cases} B_1 = a_{11} \cdot I_1 + a_{12} \cdot I_2 + \ldots + a_{1n} \cdot I_n \\ B_2 = a_{21} \cdot I_1 + a_{22} \cdot I_2 + \ldots + a_{2n} \cdot I_n \\ B_3 = a_{31} \cdot I_1 + a_{32} \cdot I_2 + \ldots + a_{3n} \cdot I_n \\ \vdots \qquad\qquad \vdots \\ B_m = a_{m1} \cdot I_1 + a_{m2} \cdot I_2 + \ldots + a_{mn} \cdot I_n \end{cases} \quad (1)$$

where $a_{11}$ to $a_{mn}$ are coefficients, $B_1$ to $B_m$ are a magnetic flux density and $I_1$ to $I_m$ are an electric current.

8 Claims, 5 Drawing Sheets

(51) Int. Cl.
*G01R 19/25* (2006.01)
*G01R 15/20* (2006.01)

(58) Field of Classification Search
USPC ........... 702/64, 104, 131; 324/117 H, 117 R, 324/156, 227
See application file for complete search history.

(56) References Cited

U.S. PATENT DOCUMENTS

| | | | |
|---|---|---|---|
| 7,106,047 | B2 | 9/2006 | Taniguchi |
| 7,205,757 | B2 * | 4/2007 | Itoh ...................... G01R 15/202 324/117 R |
| 2005/0012496 | A1 | 1/2005 | Taniguchi |
| 2009/0021249 | A1 | 1/2009 | Kumar et al. |
| 2014/0139203 | A1 | 5/2014 | Hozumi et al. |

FOREIGN PATENT DOCUMENTS

| | | |
|---|---|---|
| JP | 2005-037323 A | 2/2005 |
| JP | 2010-008315 | 1/2010 |
| JP | 2010-060506 A | 3/2010 |
| JP | 2011-080970 A | 4/2011 |
| JP | 2013-170878 | 9/2013 |
| WO | 2013058282 A1 | 4/2013 |
| WO | 2013068360 A1 | 5/2013 |

\* cited by examiner

ELECTRIC CURRENT SENSOR

The present application is based on Japanese patent application No. 2014-008776 filed on Jan. 21, 2014, the entire contents of which are incorporated herein by reference.

BACKGROUND OF THE INVENTION

1. Field of the Invention

This invention relates to an electric current sensor.

2. Description of the Related Art

An electric current sensor is known which detects the strength of a magnetic field generated by a current flowing through a bus bar and which derives the current flowing through the bus bar by calculation from the magnetic field strength detected by the magnetic detection element.

MR (Magneto Resistance) sensors and GMR (Giant Magneto Resistive effect) sensors are known as the magnetic detection element.

Prior art related to the invention of the present application may include e.g. JP-B-5153481 and JP-A-2013-170878.

SUMMARY OF THE INVENTION

It is desired to use a higher sensitivity magnetic detection element such as GMR sensor so as to conduct a more accurate measurement.

However, in case of detecting an electric current flowing through, e.g., each phase of a three-phase motor, if a magnetic detection element having a higher sensitivity such as a GMR sensor is used, a problem may arise that it detects not only a magnetic field generated in a bus bar to be detected but also the magnetic field generated due to an electric current flowing through another bus bar adjacent to the detected bus bar. Thus, it may fail to have sufficient detection accuracy.

It is an object of the invention to provide an electric current sensor that allows the use of a high-sensitivity magnetic detection element so as to conduct a more accurate measurement.

(1) According to one embodiment of the invention, an electric current sensor comprises:

a plurality of bus bars arranged in parallel;

a plurality of magnetic detection elements that are provided such that a number thereof is not less than a number of the bus bars, and that are adapted to detect a strength of a magnetic field generated by an electric current flowing through the bus bars and to output a voltage according to the strength of the magnetic field detected; and an arithmetic operation part to arithmetically operate an electric current flowing through each of the bus bars based on the voltage output from the plurality of magnetic detection elements, wherein the arithmetic operation part comprises a magnetic flux density arithmetic operation part to arithmetically operate a magnetic flux density based on the voltage output from the plurality of magnetic detection elements, and an electric current arithmetic operation part to arithmetically operate an electric current I1 to Im flowing through each of the bus bars based on formula (1) below, $$\begin{cases} B_1 = a_{11} \cdot I_1 + a_{12} \cdot I_2 + \ldots + a_{1n} \cdot I_n \\ B_2 = a_{21} \cdot I_1 + a_{22} \cdot I_2 + \ldots + a_{2n} \cdot I_n \\ B_3 = a_{31} \cdot I_1 + a_{32} \cdot I_2 + \ldots + a_{3n} \cdot I_n \\ \vdots \qquad \vdots \\ B_m = a_{m1} \cdot I_1 + a_{m2} \cdot I_2 + \ldots + a_{mn} \cdot I_n \end{cases} \quad (1)$$

where $a_{11}$ to $a_{mn}$ are coefficients,

B1 to Bm are a magnetic flux density of the respective magnetic detection elements calculated by the magnetic flux density arithmetic operation part and I1 to Im are an electric current flowing through the respective bus bars.

In the above embodiment (1) of the invention, the following modifications and changes can be made.

(i) At least one of the bus bars is provided with a through hole that penetrates the one of the bus bars, wherein an electric current path is formed on both sides of the through hole, and wherein at least one of the magnetic detection elements is arranged in the through hole so as to detect a strength of a synthetic magnetic field obtained by synthesizing a magnetic field generated due to an electric current flowing through the electric current path formed on the both sides of the through hole.

(ii) The magnetic detection element arranged in the through hole is arranged at a position in which the strength of the synthetic magnetic field is zero.

(iii) The bus bars comprise three bus bars to flow therethrough an electric current of each phase of a three-phase alternating current, wherein the bus bars are aligned and arranged apart from each other in a width direction so as to be parallel to each other in a longitudinal direction thereof, wherein the through hole is formed in the bus bars arranged on both sides in the alignment direction, corresponding one of the magnetic detection elements being arranged in the through hole, and wherein the magnetic detection elements are arranged on at least one side of the three bus bars.

(iv) The plurality of bus bars are aligned and arranged apart from each other in the thickness direction so as to be parallel to each other in a longitudinal direction thereof, and wherein the through hole is formed in the plurality of the bus bars and the magnetic detection elements are each correspondingly arranged in the through hole.

(v) The plurality of the magnetic detection elements are mounted on a single circuit substrate.

(vi) The magnetic detection elements comprise a GMR sensor.

(vii) The electric current sensor further comprises a temperature sensor configured to measure a temperature of the circuit substrate mounting the magnetic detection elements, wherein the magnetic flux density arithmetic operation part of the arithmetic operation part is adapted to make a correction based on the temperature measured by the temperature sensor when arithmetically operating the magnetic flux density based on the voltage output from the plurality of the magnetic detection elements.

(viii) The arithmetic operation part further comprises an element abnormality determination part to monitor the voltage output from the magnetic detection elements so as to output an abnormal signal when the voltage is not less than a preset upper limit threshold value or not more than a preset lower limit threshold value.

(ix) The bus bars comprise three bus bars to flow therethrough an electric current of each phase of a three-phase alternating current, and wherein the arithmetic operation part further comprises an electric current abnormality determination part to monitor the electric current calculated by the electric current arithmetic operation part so as to output an abnormal signal when the electric current flowing through the bus bars is not a three-phase alternating current.

Effects of the Invention

According to one embodiment of the invention, an electric current sensor can be provided that allows the use of a high-sensitivity magnetic detection element so as to conduct a more accurate measurement.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Hereinafter, the embodiments according to the invention will be explained in accordance with the attached drawings.

First, a principle of an electric current sensor of the invention will be explained.

Figure 1:
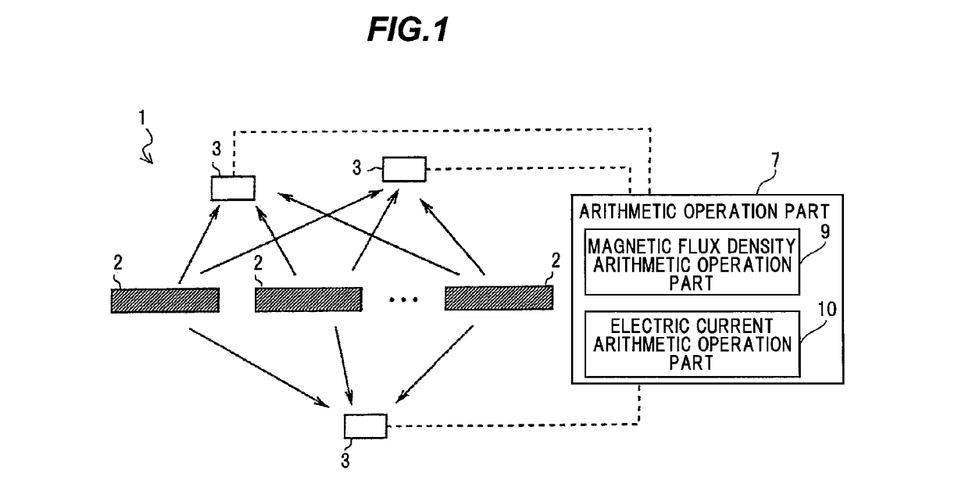
FIG. 1 is an explanatory view showing a principle of an electric current sensor of the invention.

FIG. 1 is an explanatory view showing a principle of the electric current sensor of the invention.

As shown in FIG. 1, an electric current sensor 1 includes a plurality of bus bars 2 arranged in parallel, a plurality of magnetic detection elements 3 configured to be disposed such that the number thereof is not less than the number of the bus bars 2, and configured to detect a strength of a magnetic field generated due to an electric current flowing through the bus bars 2 and simultaneously output a voltage according to the strength of the magnetic field detected, and an arithmetic operation part 7 configured to arithmetically operate an electric current flowing through the respective bus bars 2 based on the voltage output by a plurality of magnetic detection elements 3.

Here, a case of detecting an electric current flowing through each of n bus bars is explained. In this case, not less than n magnetic detection elements 3 are needed. Here, m (m≥n) magnetic detection elements 3 are used. In FIG. 1, as a matter of convenience, only three magnetic detection elements 3 are shown as a representative.

Each of the magnetic detection elements 3 is configured to detect a synthetic magnetic field obtained by synthesizing magnetic fields respectively generated due to electric currents flowing through each of the bus bars 2. At this time, a strength of a magnetic field detected by each of the magnetic detection elements 3, namely a magnetic flux density $B_1$ to $B_m$ is changed according to an electric current $I_1$ to $I_m$ flowing through each of the bus bars 2, a distance from each of the bus bars 2, a frequency and the like. When an influence by the distance from the bus bars 2, the frequency and the like is represented by $a_{11}$ to $a_{mn}$, the following relational expression of formula (2) is obtained.

$$\begin{cases} B_1 = a_{11} \cdot I_1 + a_{12} \cdot I_2 + \ldots + a_{1n} \cdot I_n \\ B_2 = a_{21} \cdot I_1 + a_{22} \cdot I_2 + \ldots + a_{2n} \cdot I_n \\ B_3 = a_{31} \cdot I_1 + a_{32} \cdot I_2 + \ldots + a_{3n} \cdot I_n \\ \vdots \qquad\qquad \vdots \\ B_m = a_{m1} \cdot I_1 + a_{m2} \cdot I_2 + \ldots + a_{mn} \cdot I_n \end{cases} \quad (1)$$

where $a_{11}$ to $a_{mn}$ are coefficients.

The magnetic flux density $B_1$ to $B_m$ can be arithmetically operated based on an output value of the magnetic detection element 3, and the coefficients $a_{11}$ to $a_{mn}$ can be determined based on a positional relationship between each of the magnetic detection elements 3 and the bus bar 2, and a frequency of the electric current, and can be preset by actual measurements. Consequently, by solving the simultaneous equations of the formula (1), the electric current $I_1$ to $I_m$ flowing through each of the bus bars 2 can be calculated.

Thus, in the electric current sensor 1, the arithmetic operation part 7 includes a magnetic flux density arithmetic operation part 9 configured to arithmetically operate the magnetic flux density $B_1$ to $B_m$ based on the voltage output by a plurality of the magnetic detection elements 3, and an electric current arithmetic operation part 10 configured to arithmetically operate the electric current $I_1$ to $I_m$ flowing through the respective bus bars 2 based on the above-mentioned relational expression of formula (1).

By constituting it this way, it is considered that even if the magnetic detection elements 3 having a high sensitivity such as a GMR sensor are used, regardless of an interference of magnetic field generated in each of the bus bars 2, the electric current $I_1$ to $I_m$ can be detected, so that the detection accuracy can be heightened. In addition, a distance between the bus bars 2 is configured to be relatively narrow so as to be able to detect the electric current $I_1$ to $I_m$ with high accuracy, even if the interference of magnetic field is increased, thus it also contributes to a down-sizing of the electric current sensor 1.

Next, a first embodiment of the invention will be explained.

Figure 2:
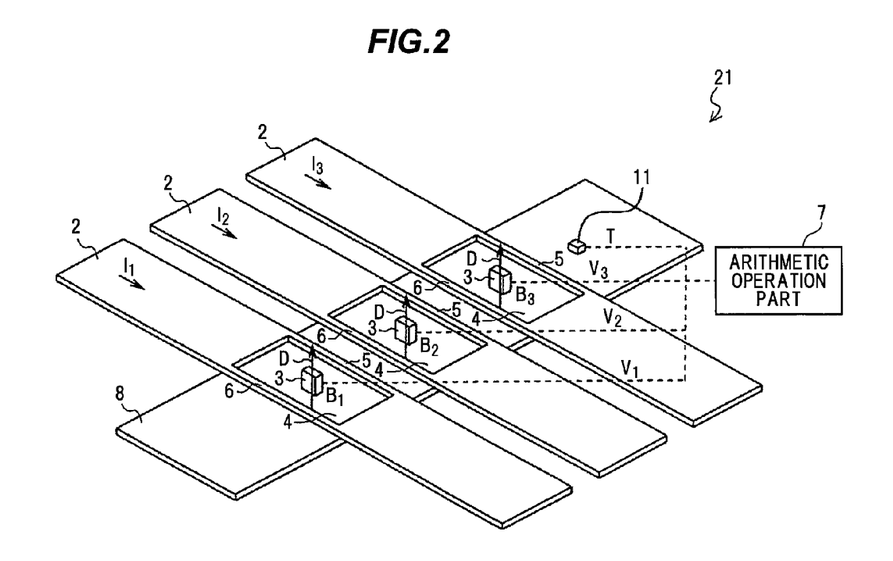
FIG. 2 is a perspective view schematically showing an electric current sensor according to a first embodiment of the invention.
Figure 3:
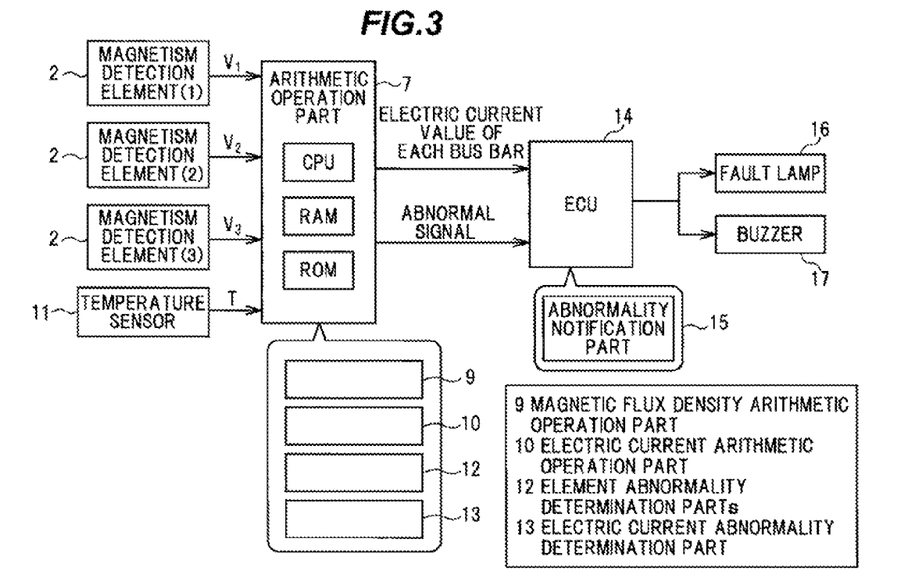
FIG. 3 is a block diagram showing an input-output configuration of an arithmetic operation part in the electric current sensor shown in FIG. 2.

As shown in FIGS. 2 and 3, the electric current sensor 21 according to the first embodiment includes three bus bars 2 configured to allow an electric current of each phase of a three-phase alternating current to flow therethrough, and three magnetic detection elements 3 corresponding to the three bus bars 2.

The bus bars 2 are constituted of a conductor having a plate-like shape, and configured to be electric current paths through which electric currents flow. The electric currents that flow through the bus bars 2 are, for example, maximum almost 200 A in steady state and maximum almost 800 A at an inrush current in abnormal state or the like, and the frequency is, for example, maximum almost 100 kHz. The three bus bars 2 are arranged in the same plane, and aligned and arranged at equal intervals in the width direction so as to be parallel to each other in the longitudinal direction.

The magnetic detection element 3 is configured to output an output signal according to the strength of magnetic field (magnetic flux density) in a direction along the detection axis (D). In the first embodiment, as the magnetic detection element 3, a GMR sensor having a high sensitivity is used.

Figure 4:
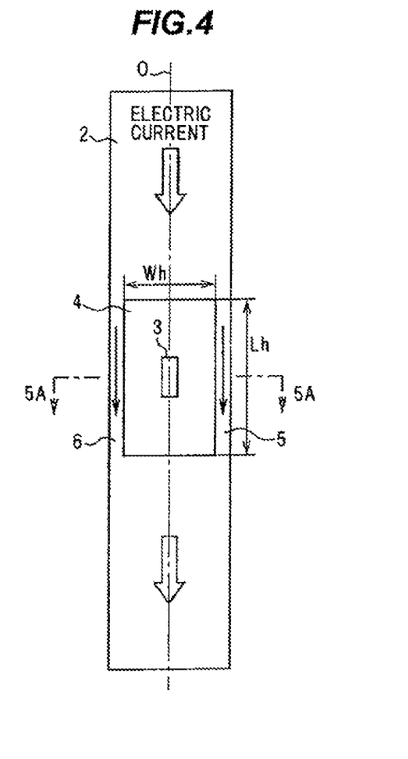
FIG. 4 is a plan view explaining a positional relationship between a bus bar and a magnetic detection element in the electric current sensor shown in FIG. 2.
Figure 5:
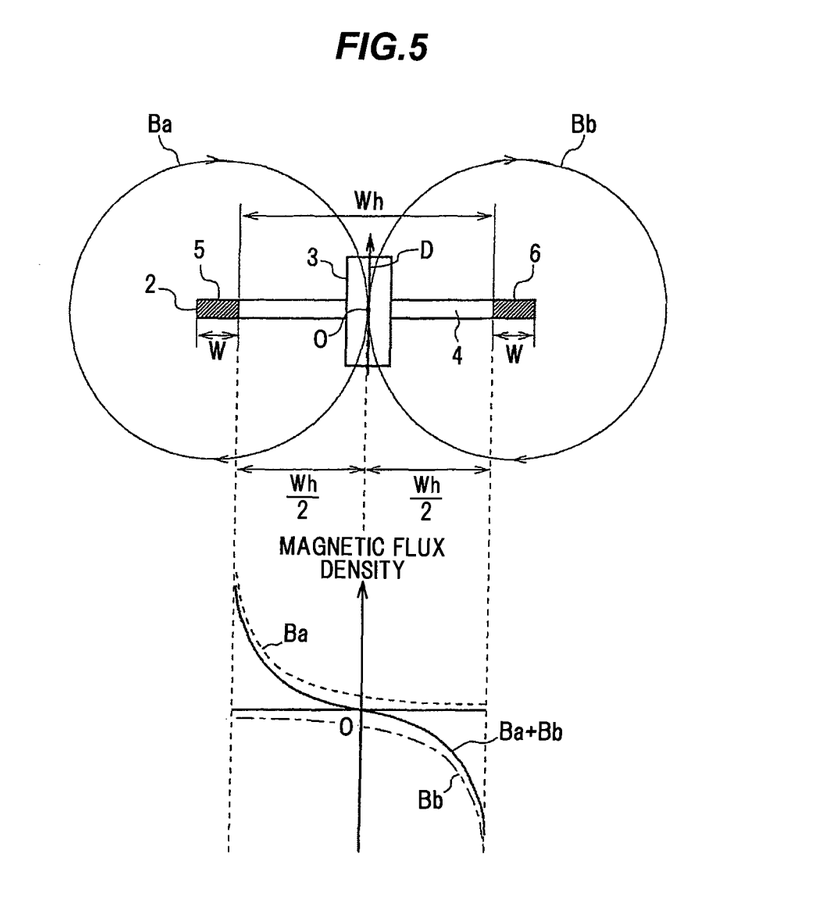
FIG. 5 is a cross-sectional view taken along the line 5A-5A in FIG. 4 and is an explanatory view showing a distribution of a magnetic flux density in the cross-section.

As shown in FIGS. 2, 4 and 5, the electric current sensor 21 is configured such that through holes 4 that penetrate the bus bars 2 are formed in the bus bars 2 and the magnetic detection elements 3 are arranged in the through holes 4. The magnetic detection elements 3 are arranged such that the detection axis (D) thereof is along the thickness direction of the bus bars 2. Namely, the magnetic detection elements 3 are arranged such that the detection axis (D) thereof is perpendicular to the surfaces of the bus bars 2. Here, in case that the magnetic detection element 3 is a GMR sensor, the detection axes are constituted of not less than two axes, thus in this case, a specific one axis is configured to be perpendicular to the surfaces of the bus bars 2. Further, the detection axis (D) of the magnetic detection element 3 may be inclined by almost minus 10 degrees to plus 10 degrees with respect to the direction perpendicular to the surfaces of the bus bars 2.

The through holes 4 are formed so as to penetrate the center part of the bus bar 2, and the periphery of the through holes 4 is surrounded by the bus bar 2. Namely, the through hole 4 is not a hole having a cutout shape formed such that a part thereof opens in the side of the bus bar 2. By forming the through holes 4 as mentioned above, as a result, the electric current paths 5, 6 are formed on both sides of the through holes 4.

By forming the electric current paths 5, 6 on both sides of the through holes 4, in the through holes 4, the components of the magnetic fields in the thickness direction generated in both of the electric current paths 5, 6 offset each other. The magnetic detection elements 3 arranged in the through holes 4 detect a strength of a synthetic magnetic field obtained by synthesizing magnetic fields respectively generated due to electric currents flowing through the electric current paths 5, 6 formed on both sides of the through holes 4, namely a strength of magnetic fields that are generated in both of the electric current paths 5, 6 and offset each other, thus the positions in which the magnetic detection elements 3 are arranged are adjusted, thereby a degree of the offsetting can be adjusted, so that it becomes possible to adjust to what extent a strength of magnetic fields is to be detected, the magnetic fields being generated in the bus bars 2 in which the magnetic detection elements 3 are arranged.

Namely, even if the electric currents flowing through the bus bars 2 are large and the strengths of magnetic field generated in the respective electric current paths 5, 6 are large, the electric current sensor 1 makes it possible to allow the above-mentioned currents and strengths to offset each other so as to allow the magnetic detection elements 3 to detect a magnetic field having an appropriate strength, so that even if a GMR sensor having a high sensitivity is used as the magnetic detection element 3, it becomes possible to carry out the measurement.

In case of using a GMR sensor as the magnetic detection element 3, it is preferable that the magnetic detection elements 3 are arranged at a position in which a magnetic flux density of the magnetic field (the magnetic field obtained by synthesizing magnetic fields generated in the three bus bars 2) to be detected becomes not less than 0 and not more than 5 mT. This is because in case of a general GMR sensor, the output is saturated under the condition that the magnetic flux density is more than 5 mT so that it becomes difficult to carry out the measurement. Further, the magnitude of the magnetic flux density mentioned above means a density in a steady state, and a case that becomes temporarily more than 5 mT in an abnormal state and a transient state is to be excluded.

In addition, a GMR sensor is configured such that a region in which the magnetic flux density can be detected with high accuracy (a region in which the magnetic flux density and the output voltage become linear) is normally not more than 2 mT, thus more preferably, it is desired that the magnetic detection elements 3 are arranged at a position in which the magnetic flux density (the magnetic flux density in a steady state) of the magnetic field to be detected becomes more than 0 and not more than 2 mT.

Further, in the specification, a configuration "the magnetic detection elements 3 are arranged in the through holes 4" means a configuration "at least a part of the magnetic detection element 3 is housed in the bus bar 2", in other word, means a configuration "at least a part of the magnetic detection element 3 is overlapped with the bus bar 2 in a transverse cross sectional view or in a side view". In the electric current sensor 1, the magnetic detection elements 3 are arranged such that the centers thereof (the centers in the thickness direction (the perpendicular direction in FIG. 2) of the bus bars 2) coincident with the center of the bus bars 2 in the thickness direction. Due to this, in case that a GMR sensor is used as the magnetic detection element 3, the directions of the magnetic fields entering into the magnetic detection elements 3 become only a direction parallel to the detection axis (D) of the magnetic detection element 3, so that it becomes possible to easily carry out the detection of electric current with high accuracy.

In the vicinity of the end part of the through holes 4 in the longitudinal direction, an electric current having a component in the width direction flows, thereby an error is caused, thus it is preferable that the magnetic detection elements 3 are arranged at a position apart from the end part of the through holes 4 in the longitudinal direction to the extent of being not affected by the electric current having a component in the width direction, and the magnetic detection elements 3 are arranged in the center parts of the through holes 4 in the longitudinal direction of the bus bars 2. In consideration of the magnitude of the electric current flowing through the bus bars 2 and the like, the length (Lh) of the through holes 4 may be a length by which the magnetic detection elements 3 can be arranged at a position of being not affected by the magnetic fields generated in the vicinity of the end part of the through holes 4 in the longitudinal direction.

In the first embodiment, the through holes 4 are formed in a symmetrical shape to the center axis (O) of the bus bars 2 and the on both side of the through holes 4 are formed in a symmetrical shape to each other. By constituting it this way, in the electric current paths 5, 6, symmetrical magnetic fields to each other are generated.

As shown in FIG. 5, the distributions in the through holes 4 of the magnetic flux density (Ba) generated due to the electric current path 5 and the magnetic flux density (Bb) generated due to the electric current path 6 are almost in inverse proportion to the distances from the electric current paths 5, 6, and the directions of the magnetic flux densities (Ba, Bb) generated due to both of the electric current paths 5, 6 become opposite direction to each other. The electric current paths 5, 6 on both sides of the through holes 4 are formed so as to have a symmetrical shape to each other, thereby the magnetic fields generated due to both of the electric current paths 5, 6 perfectly offset to each other on the center axis (O) of the bus bars 2 so that the magnetic flux density (Ba+Bb) becomes zero. In the graph of FIG. 5, the distribution of the magnetic flux density (Ba) generated due to the electric current path 5 on the left side of FIG. 5 is shown by a thin and broken line, the distribution of the magnetic flux density (Bb) generated due to the electric current path 6 on the right side of FIG. 5 is shown by a thin and alternate long and short dash line, and the distribution of the magnetic flux density (Ba+Bb) obtained by synthesizing the magnetic fields generated due to both of the electric current paths 5, 6 is shown by a thick and solid line.

Consequently, the magnetic detection elements 3 are arranged at an appropriate position in which the center thereof in the width direction is displaced from the center axis (O) of the bus bars 2, thereby it becomes possible to allow the magnetic detection elements 3 to detect the optimum magnitude of the magnetic flux density (Ba+Bb) and to carry out the measurement with high accuracy. In addition, the magnetic detection elements 3 are arranged at a position in which the center thereof in the width direction is overlapped with the center axis (O) of the bus bars 2, thereby it becomes also possible to allow the magnetic detection elements 3 not to detect the magnetic field generated in the bus bars 2 in which the magnetic detection elements 3 are arranged.

In the electric current sensor 1 according to the first embodiment, each of the magnetic detection elements 3 is arranged at a position in which the center thereof in the width direction is overlapped with the center axis (O) of the bus bars 2, namely a position in which a strength of the synthetic magnetic field obtained by synthesizing the magnetic fields respectively generated due to the electric currents flowing through both of the electric current paths 5, 6 becomes zero. Due to this, each of the magnetic detection elements 3 detects only a strength of the magnetic fields generated in two bus bars 2 other than the bus bar 2 in which the magnetic detection element 3 itself is arranged.

As a result, the object to be detected by each of the magnetic detection elements 3 is the bus bars 2 other than the bus bar 2 in which the magnetic detection element 3 itself is arranged, thus a distance from the bus bars 2 of the object to be detected is increased, so that even if the electric currents flowing through the bus bars 2 are large, it becomes possible to use a GMR sensor having a higher sensitivity or the like as the magnetic detection elements 3. In addition, the distance from the bus bars 2 of the object to be detected is increased, thereby it becomes also possible to reduce an influence of a bias in an electric current density due to a skin effect.

In addition, in the electric current sensor 21, in the vicinity of the center axis (O) of the bus bars 2, the distribution of the magnetic flux density (Ba+Bb) obtained by synthesizing the magnetic fields generated due to both of the electric current paths 5, 6 become relatively near to flatness, thus it becomes possible to reduce an error due to a disturbance, so as to be excellent in a robustness. The more the width (Wh) of the through holes 4 is large, the more the distribution of the magnetic flux density (Ba+Bb) in the vicinity of the center axis (O) becomes near to flatness, thus in terms of enhancing a robustness, it is preferable that the width (Wh) of the through holes 4 is enlarged as much as possible.

In addition, it is preferable that the width (W) of the electric current paths 5, 6 is configured to have a width to suppress an influence of a skin effect in consideration of the frequency of the electric current flowing through the bus bars 2. In case of using copper or a copper alloy as the bus bars 2, the skin thickness at a frequency of 100 kHz is almost 0.2 mm, thus in the first embodiment, the width (W) of the electric current paths 5, 6 is preferably not more than 0.5 mm, and more preferably not more than 0.2 mm. Further, the skin thickness at a frequency of 10 kHz is almost 1 mm, thus in this case, the width (W) of the electric current paths 5, 6 is preferably not more than 2 mm, and more preferably not more than 1 mm.

However, if the width (W) of the electric current paths 5, 6 is extremely reduced, the cross-sectional area of the electric current paths 5, 6 is reduced, thereby resistance is increased, so that loss is increased and heat generation is also increased. Consequently, it is preferable that the width (W) of the electric current paths 5, 6 and the width (Wh) of the through holes 4 are appropriately set in consideration of an influence due to a skin effect, and loss, heat generation and the like to be allowed.

Also, as to the thickness of the electric current paths 5, 6 (the thickness of the bus bars 2), it is preferable that the thickness is a thickness to suppress an influence of a skin effect in consideration of the frequency of the electric current flowing through the bus bars 2, and in case that copper or a copper alloy is used as the bus bars 2 and the frequency of the electric current flowing through the bus bars 2 is not more than 100 kHz, the thickness of the electric current paths 5, 6 is preferably not more than 0.5 mm and more preferably not more than 0.2 mm. In addition, in case that the frequency of the electric current flowing through the bus bars 2 is not more than 10 kHz, the thickness of the electric current paths 5, 6 is preferably not more than 2 mm and more preferably not more than 1 mm.

Further, in the first embodiment, the through holes 4 are formed in a symmetrical shape with respect to the center axis (O) of the bus bars 2 and the electric current paths 5, 6 on both sides of the through holes 4 are formed in a symmetrical shape to each other, but the electric current paths 5, 6 on both sides of the through holes 4 may be formed in an asymmetrical shape to each other and the through holes 4 may be formed in an asymmetrical shape. For example, in case of making one width (W) of the electric current paths 5, 6 larger than another width (W) of the electric current paths 5, 6, the magnetic detection elements 3 can be arranged on the center axis (O) of the bus bars 2, and can also be arranged on the center of the through holes 4 in the width direction. However, if a difference between the widths (W) of the electric current paths 5, 6 is increased, a phenomenon such as a reverse flow of electric current occurs, thereby an error is caused, thus it is needed to adjust the widths (W) of the electric current paths 5, 6 so as not to become extremely different.

In addition, in case that the electric current paths 5, 6 are formed in a symmetrical shape to each other, or the through holes 4 are formed in an asymmetrical shape, a difference occurs between the electric currents flowing through both of the electric current paths 5, 6, thereby a difference occurs between the strengths of magnetic fields generated in both of the electric current paths 5, 6, the distribution of the magnetic flux density does not become a uniform distribution as shown in FIG. 5 but becomes a biased distribution, so that there is a risk that it is easily affected by a disturbance from a specific direction. Consequently, in terms of enhancing a robustness, it is more preferable the through holes 4 are formed in a symmetrical shape with respect to the center axis (O) of the bus bars 2 and the electric current paths 5, 6 on both sides of the through holes 4 are formed in a symmetrical shape to each other.

In addition, in the first embodiment, the through holes 4 are formed in a rectangular shape in planar view, but the shape of the through holes 4 is not particularly limited to this, for example, the through holes 4 may be formed in an elliptical shape or a polygonal shape. However, in case that the through holes 4 are formed in an elliptical shape or a polygonal shape, an electric current having a component in the width direction occurs in the electric current paths 5, 6, thereby an error is caused, thus it is more preferable that the electric current paths 5, 6 on both sides of the through holes 4 are formed in a linear shape along the longitudinal direction of the bus bars 2.

In addition, in the electric current sensor 21 according to the first embodiment, a plurality (three in this case) of the magnetic detection elements 3 are mounted on a single circuit substrate 8. As a matter of convenience, FIG. 1 shows such that the magnetic detection elements 3 and the arithmetic operation part 7 are directly connected to each other, but actually the two are connected to each other via a wiring pattern formed in the circuit substrate 8. The arithmetic operation part 7 may be mounted on the circuit substrate 8.

All the magnetic detection elements 3 are mounted on a single circuit substrate 8, thereby the assembling work becomes easy in comparison with a case that each of the magnetic detection elements 3 is mounted on the respective different circuit substrates. In addition, for example, if the relative position of the respective bus bars 2 is configured to preliminarily be fixed to each other, only the positioning of a single circuit substrate 8 is carried out, thereby the positioning of all the magnetic detection elements 3 with respect to bus bars 2 can be carried out, so that it becomes also possible to easily carry out the positioning work.

It is preferable that the magnetic detection elements 3 are mounted on the same surface of the circuit substrate 8. This is because in case that the magnetic detection elements 3 are mounted on each of both surfaces of the circuit substrate 8, it is needed to mount the magnetic detection elements 3 on one surface, and then mount the magnetic detection elements 3 on another surface, so that it takes time and labor in the mounting work of the magnetic detection elements 3.

The magnetic detection elements 3 are aligned and arranged on the circuit substrate 8 linearly at equal intervals. Here, the circuit substrate 8 is configured to have an elongated shape and is arranged such that the longitudinal direction thereof is perpendicular to the longitudinal direction of the bus bars 2, and simultaneously the magnetic detection elements 3 are arranged on the circuit substrate 8 along the longitudinal direction of the circuit substrate 8 linearly at equal intervals. The magnetic detection elements 3 are arranged such that the detection axis (D) thereof is perpendicular to the surface of the circuit substrate 8. Further, the shape of the circuit substrate 8 is not particularly limited to this, the intervals between the magnetic detection elements 3 are not needed to be equal intervals.

Further, in the electric current sensor 21, the magnetic detection elements 3 are arranged in the through holes 4, thereby the bus bars 2 are arranged on the surface of the circuit substrate 8 in the side where the magnetic detection elements 3 are mounted, thus it becomes possible that the bus bars 2 and the magnetic detection elements 3 are collectively arranged in the side of one surface of the circuit substrate 8, so that the electric current sensor 1 can be reduced in size and thickness.

Next, the arithmetic operation part 7 will be explained.

As shown in FIG. 3, the arithmetic operation part 7 is realized by combining memory devices constituted of CPU, ROM and RAM, and software programs. To the arithmetic operation part 7, the signal of the voltage $V_1$ to $V_3$ output from each of the magnetic detection elements 3 is input. In addition, the first embodiment is configured to include a temperature sensor 11 that measure a temperature of the circuit substrate 8, and a signal of the temperature (T) output by the temperature sensor 11 is input to the arithmetic operation part 7.

The magnetic flux density arithmetic operation part 9 in the arithmetic operation part 7 calculates a magnetic flux density (B) by using the following formula (2), in case of a region in which the magnetic flux density detected by the magnetic detection elements 3 and the output voltage become linear (in case that the magnetic detection element 3 is a GMR sensor, a region in which the magnetic flux density (B) falls within the range of not less than −0.5 mT and not more than 0.5 mT).

$$V=aB+b \qquad (2)$$

where a and b are coefficients, V is output voltage of magnetic detection element, and B is magnetic flux density.

In addition, the magnetic flux density arithmetic operation part 9 calculates a magnetic flux density (B) by using the following formula (3), in case of a region in which the magnetic flux density detected by the magnetic detection elements 3 and the output voltage do not become linear (in case that the magnetic detection element 3 is a GMR sensor, a region in which the magnetic flux density (B) falls within the range of less than −0.5 mT or more than 0.5 mT).

$$V=a\sin^2(cB+d)+e \qquad (3)$$

where a to e are coefficients, V is output voltage of magnetic detection element, and B is magnetic flux density.

The relationship between the magnetic flux density and the output voltage in the magnetic detection elements 3 has a temperature dependency, thus here the magnetic flux density arithmetic operation part 9 is configured to carry out correction by changing the coefficients a to e in the formulae (2), (3) dependent on the temperature (T). Namely, the magnetic flux density arithmetic operation part 9 is configured to carry out correction dependent on the temperature measured by the temperature sensor 11 at the time of calculating the magnetic flux density from the voltage output by the magnetic detection elements 3.

In addition, as mentioned above, in the electric current sensor 21, the magnetic detection element 3 does not detect the magnetic field of the bus bar 2 in which the magnetic detection element 3 itself is arranged, thus when an electric current flowing through the respective bus bars 2 is defined as the electric current $I_1$ to $I_3$, and a magnetic flux density detected by the magnetic detection elements 3 corresponding thereto is defined as the magnetic flux density $B_1$ to $B_3$, the electric current arithmetic operation part 10 is configured to arithmetically operate the electric current $I_1$ to $I_3$ flowing through the respective bus bars 2 by using the following formula (4).

$$\begin{cases} B_1 = a_{12} \cdot I_2 + a_{13} \cdot I_3 \\ B_2 = a_{21} \cdot I_1 + a_{23} \cdot I_3 \\ B_3 = a_{31} \cdot I_1 + a_{32} \cdot I_2 \end{cases} \quad (4)$$

where $a_{12}$ to $a_{32}$ are coefficients.

As mentioned above, the magnetic detection element 3 is arranged at a position in which a strength of the magnetic field generated in the bus bar 2 in which the magnetic detection element 3 itself is arranged becomes zero, thereby it becomes possible to simplify the relational expression like the formula (4) at the time of carrying out calculation in the electric current arithmetic operation part 10, so as to contribute to the speed up of the calculation.

The electric current arithmetic operation part 10 outputs the electric current $I_1$ to $I_3$ obtained by the calculation. Here, the electric current arithmetic operation part 10 is configured to output an analog signal of voltage according to the obtained electric current $I_1$ to $I_3$ to an ECU (Electron Control Unit) 14 of a motor vehicle. Further, the signal output by the electric current arithmetic operation part 10 may be a digital signal.

In addition, the arithmetic operation part 7 further includes an element abnormality determination part 12 that is configured to monitor a voltage output by each of the magnetic detection elements 3, and determine that abnormality occurs in the magnetic detection elements 3 when the voltage is not less than the preset upper threshold value or not more than the preset lower threshold value, so as to output an abnormal signal. The upper threshold value and the lower threshold value that the element abnormality determination part 12 uses in the determination of the magnetic detection elements 3 are set to values that are normally not output by the magnetic detection elements 3 and can be definitely determined as abnormality.

Furthermore, the arithmetic operation part 7 further includes an electric current abnormality determination part 13 that is configured to monitor the electric current $I_1$ to $I_3$ flowing through each of the bus bars 2 calculated by the electric current arithmetic operation part 10, and determine that abnormality occurs in the electric current flowing through the bus bars 2 or the magnetic detection elements 3 when the electric current flowing through each of the bus bars 2 is not a three-phase alternating current, so as to output an abnormal signal. The electric current abnormality determination part 13 is configured to determine a tendency of the electric current $I_1$ to $I_3$ for a predetermined time and output an abnormal signal in case that, for example, only one phase is definitely shifted from the other phases, only one phase is definitely different from the other phases in the electric current value, and so on.

The abnormal signal output by the element abnormality determination part 12 and the electric current abnormality determination part 13 is input to the ECU 14. In the ECU 14, an abnormality notification part 15 is mounted, and the abnormality notification part 15 is configured to notify abnormality to a driver and the like by light or sound, for example, by lighting up a fault lamp 16 such as a MIL (Malfunction Indicator Lamp) or sounding a buzzer 17 when abnormal signal is input.

Next, a control flow in the arithmetic operation part 7 will be explained by using FIG. 6.

Figure 6:
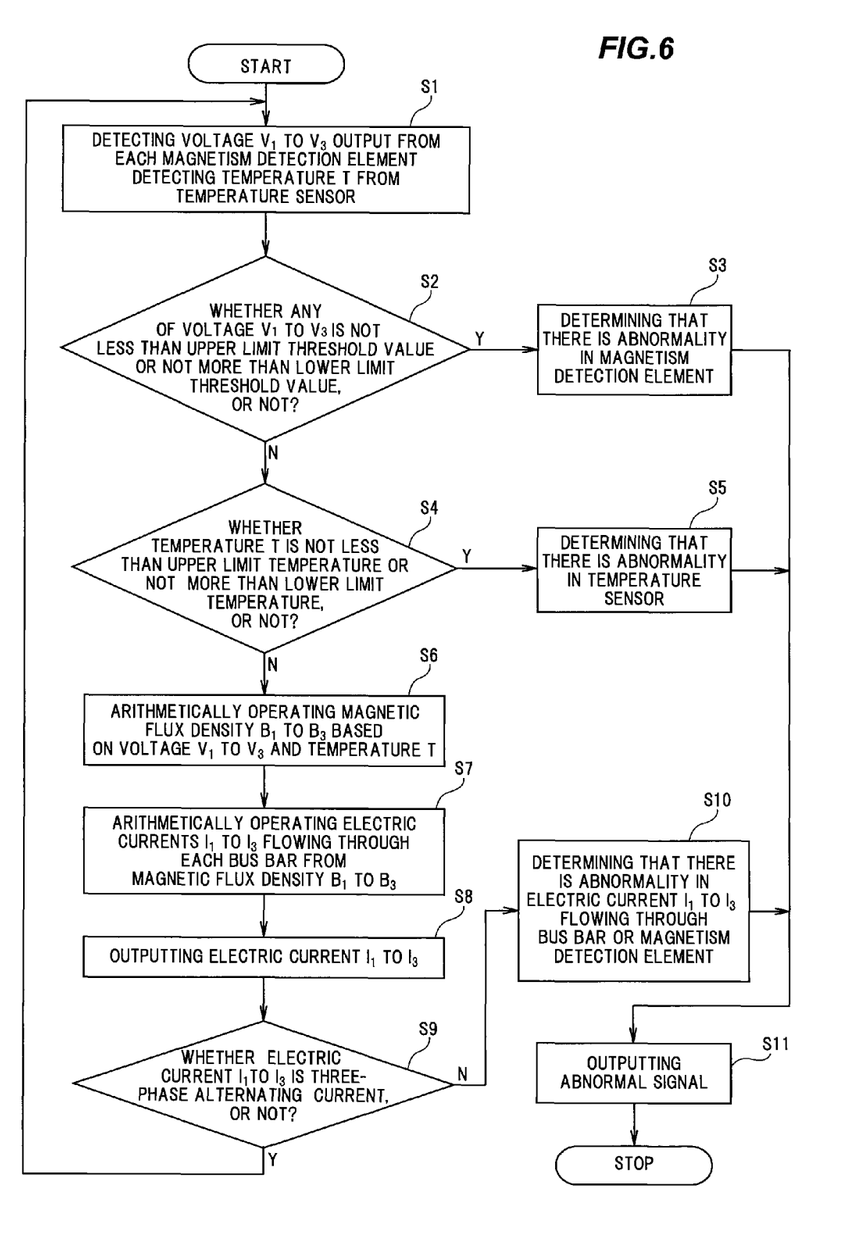
FIG. 6 is a flow chart showing a control flow of the arithmetic operation part in the electric current sensor shown in FIG. 2.

As shown in FIG. 6, first, in the step S1, the arithmetic operation part 7 detects signals of the voltage $V_1$ to $V_3$ output from each of the magnetic detection elements 3 and the temperature (T) output from the temperature sensor 11.

After that, in the step S2, the element abnormality determination part 12 determines whether any of voltage $V_1$ to $V_3$ is not less than the upper limit threshold value or not more than the lower limit threshold value, or not. Further, in the step S2, the element abnormality determination part 12 may be configured to determine whether time for which any of voltage $V_1$ to $V_3$ is not less than the upper limit threshold value or not more than the lower limit threshold value becomes not less than a predetermined time or not.

In case of being determined as YES in the step S2, the element abnormality determination part 12 determines in the step S3 that there is abnormality in the magnetic detection elements 3 and outputs an abnormal signal to the ECU 14 in the step S11, after that, interrupts the processing.

In case of being determined as NO in the step S2, the element abnormality determination part 12 determines in the step S4 whether the temperature (T) is not less than the upper limit temperature or not more than the lower limit temperature, or not. Further, in the step S4, the element abnormality determination part 12 may be configured to determine whether time for which the temperature (T) is not less than the upper limit temperature or not more than the lower limit temperature becomes not less than a predetermined time or not.

In case of being determined as YES in the step S4, the element abnormality determination part 12 determines in the step S5 that there is abnormality in the temperature sensor 11 and outputs an abnormal signal to the ECU 14 in the step S11, after that, interrupts the processing.

In case of being determined as NO in the step S4, the magnetic flux density arithmetic operation part 9 arithmetically operates in the step S6 the magnetic flux density $B_1$ to $B_3$ based on the voltage $V_1$ to $V_3$ and temperature T. Namely, while adding correction dependent on the temperature (T) thereto, the magnetic flux density arithmetic operation part 9 converts the voltage $V_1$ to $V_3$ of the magnetic detection elements 3 to the magnetic flux density $B_1$ to $B_m$.

After that, in the step S7, the electric current arithmetic operation part 10 arithmetically operates the electric current $I_1$ to $I_3$ flowing through each of the bus bars 2 from the magnetic flux density $B_1$ to $B_3$ calculated in the step S6, and outputs the electric current $I_1$ to $I_3$ calculated to the ECU 14 in the step S8.

After that, in the step S9, the electric current abnormality determination part 13 determines whether the electric current $I_1$ to $I_3$ is a three-phase alternating current, or not. In case of being determined as NO in the step S9, the electric current abnormality determination part 13 determines in the step S10 that there is abnormality in the electric current flowing through the bus bars 2 or the magnetic detection elements 3 and outputs an abnormal signal to the ECU 14 in the step S11, after that, interrupts the processing.

In case of being determined as YES in the step S9, the processing returns to the step S1 and the detection of the electric current is continued.

Further, in the control flow shown in FIG. 6, the processing is interrupted in case of determining that there is abnormality in one of the magnetic detection elements 3, but in case of including the magnetic detection elements 3 in the number more than the number of the bus bars 2, the detection of the electric current can be continued until the number of the magnetic detection elements 3 becomes less than the number of the bus bars 2.

Furthermore, even if the number of the magnetic detection elements 3 becomes less than the number of the bus bars 2, the electric current arithmetic operation part 10 may be configured to arithmetically operates an estimation value of the electric current $I_1$ to $I_3$, assuming that the electric current $I_1$ to $I_3$ is a three-phase alternating current (for example, assuming that the electric current $I_2$ is an electric current obtained by that a phase of the electric current $I_1$ is shifted by 120 degrees, so as to reduce unknown quantities in the formula (4)).

In addition, in the control flow shown in FIG. 6, the processing is interrupted in case of determining that there is abnormality in the temperature sensor 11, but in this case, the electric current arithmetic operation part 10 may be configured to continue the arithmetic operation of the electric current $I_1$ to $I_3$, using an arbitrary setting value as the temperature. Further, in case that the electric current $I_1$ to $I_3$ is not a three-phase alternating current, it cannot be determined whether abnormality occurs in the electric current itself flowing through the bus bars 2 or abnormality occurs in the magnetic detection elements 3, thus it is preferable that the processing is interrupted.

Further, in the electric current sensor 1 according to the first embodiment, in case of having good symmetric property, there is a possibility that the solution of the above-mentioned formula (4) (namely, formula (1)) becomes an indeterminate form. In this case, the problem can be solved by for example, making the intervals of the bus bars 2 different from each other and so on, so as to intentionally making the symmetric property worse, or adding the magnetic detection element 3 thereto, so as to carry out the arithmetic operation while including the magnetic detection element 3 added.

Next, a second embodiment will be explained.

Figure 7:
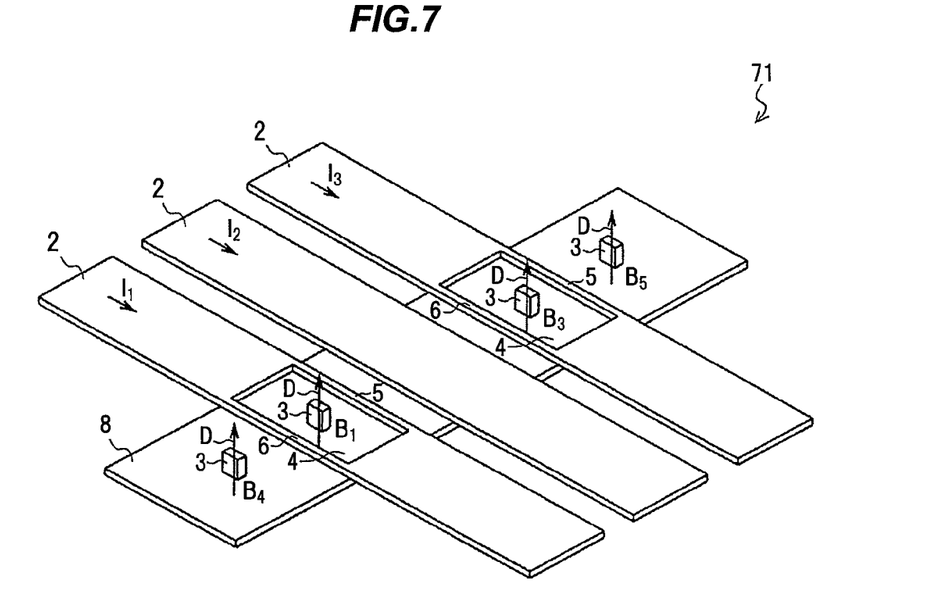
FIG. 7 is a perspective view schematically showing an electric current sensor according to a second embodiment of the invention.

As shown in FIG. 7, the electric current sensor 71 according to the second embodiment is configured such that the bus bars 2 include three bus bars 2 configured to allow an electric current of each phase of a three-phase alternating current to flow therethrough, the bus bars 2 are aligned and arranged apart from each other in the width direction so as to be parallel to each other in the longitudinal direction, through holes 4 are formed in the bus bars 2 arranged on both sides in the alignment direction, and simultaneously the magnetic detection elements 3 are arranged in each of the through holes 4, and the magnetic detection elements 3 are arranged on at least one side (in FIG. 7, on both sides respectively) of the three bus bars 2.

Namely, the electric current sensor 71 is configured such that in the electric current sensor 21 shown in FIG. 2, the through hole 4 of the bus bar 2 arranged in the center and the magnetic detection element 3 arranged in the through hole 4 are omitted, and the magnetic detection elements 3 are newly added on both sides of the bus bars 2. All the magnetic detection elements 3 are mounted on a single common circuit substrate 8. Further, in FIG. 7, the arithmetic operation part 7 is omitted.

In the electric current sensor 21 shown in FIG. 2, there is a problem that the magnetic field detected by the magnetic detection element 3 arranged in the center becomes larger in comparison with the magnetic detection elements 3 arranged on both sides, especially in case that a large electric current flows through the bus bars 2, there is a risk that a strength of the magnetic field detected by the above-mentioned magnetic detection element 3 becomes too large, so that it is difficult to carry out sensitivity adjustment by the three magnetic detection elements 3 in the same way.

For the purpose of solving the above-mentioned problem, the electric current sensor 21 according to the second embodiment is configured such that the magnetic detection element 3 of the center in which the magnetic field detected becomes too large is omitted, and the magnetic detection element 3 is arranged on the respective lateral sides away from the bus bars 2 of both sides. Namely, according to the electric current sensor 71, even if a large electric current flows through the bus bars 2, the strength of the magnetic field detected by the magnetic detection element 3 can be reduced, and the strengths of the magnetic fields detected by all the magnetic detection element 3 can be equalized to the same degree so as to easily carry out sensitivity adjustment in the same way.

In the electric current sensor 71, when an electric current flowing through the respective bus bars 2 is defined as the electric current $I_1$ to $I_3$, a magnetic flux density detected by the magnetic detection elements 3 arranged on the lateral sides away from the bus bars 2 is defined as the magnetic flux density $B_1$ to $B_3$, and a magnetic flux density detected by the magnetic detection elements 3 arranged in the through holes 4 of the bus bars 2 is defined as the magnetic flux density $B_4$, $B_5$, the electric current arithmetic operation part 10 is configured to arithmetically operate the electric current $I_1$ to $I_3$ flowing through the respective bus bars 2 by using the following formula (5).

$$\begin{cases} B_1 = a_{12} \cdot I_2 + a_{13} \cdot I_3 \\ B_3 = a_{31} \cdot I_1 + a_{32} \cdot I_2 \\ B_4 = a_{41} \cdot I_1 + a_{42} \cdot I_2 + a_{43} \cdot I_3 \\ B_5 = a_{51} \cdot I_1 + a_{52} \cdot I_2 + a_{53} \cdot I_3 \end{cases} \quad (5)$$

where $a_{12}$ to $a_{53}$ are coefficients.

Further, the electric current sensor 71 is configured such that the magnetic detection are arranged on both sides of the bus bars 2 so as to use total four magnetic detection elements 3, but only at least three magnetic detection elements 3 are needed, thus one of the magnetic detection elements 3 arranged on both sides may be omitted. However, by using four magnetic detection elements 3, there is a merit that even if one of the magnetic detection elements 3 is broken down, the detection work can be continued.

Next, a third embodiment will be explained.

Figure 8:
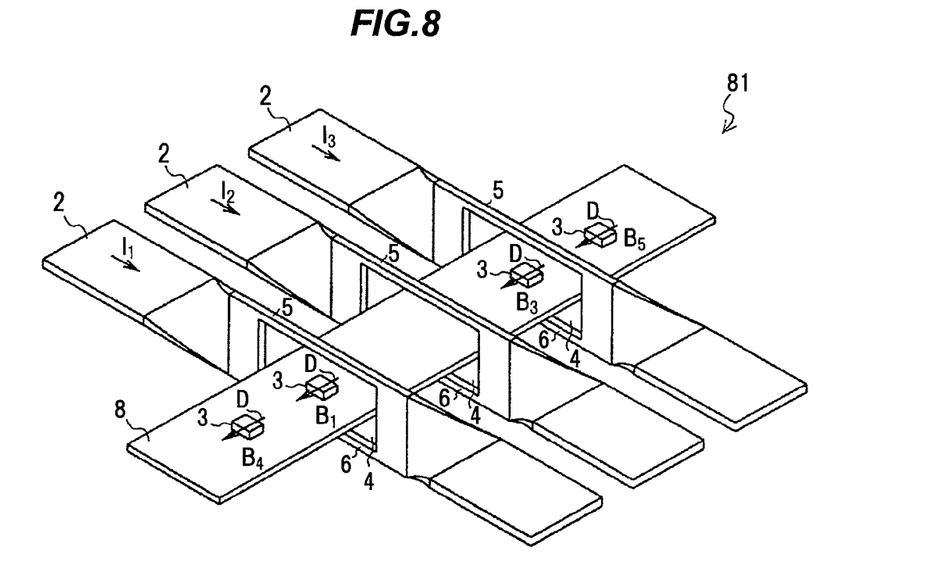
FIG. 8 is a perspective view schematically showing an electric current sensor according to a third embodiment of the invention.

As shown in FIG. 8, the electric current sensor 81 according to the third embodiment is configured such that a plurality of the bus bars 2 are aligned and arranged apart from each other in the thickness direction so as to be parallel to each other in the longitudinal direction, and the through holes 4 are formed in each of a plurality of the bus bars 2 and simultaneously the magnetic detection elements 3 are arranged in each of the through holes 4. Further, in FIG. 8, the arithmetic operation part 7 is omitted.

Similarly to the electric current sensor 71 shown in FIG. 7, the electric current sensor 81 is configured such that the magnetic detection element 3 is arranged in the respective through holes 4 of the bus bars 2 arranged on both sides in the alignment direction, and simultaneously the magnetic detection element 3 is arranged on the respective lateral sides away from the bus bars 2 arranged on both sides. Each of the magnetic detection elements 3 is mounted on a single circuit substrate 8, and the circuit substrate 8 is arranged so as to penetrate the through hole 4 of the respective bus bars 2.

The electric current arithmetic operation part 10 of the electric current sensor 81 is configured to arithmetically operate the electric current $I_1$ to $I_3$ flowing through the respective bus bars 2 based on the above-mentioned relational expression of formula (5), similarly to that of the electric current sensor 71 shown in FIG. 7.

The electric current sensor 81 shown in FIG. 8 is configured such that a part of the respective bus bars 2 aligned and arranged in the width direction is twisted by 90 degrees, thereby the above-mentioned twisted parts of the bus bars 2 are aligned and arranged in the thickness direction, but in case that the bus bars 2 are aligned and arranged in the thickness direction from the first, the bus bars 2 are not needed to be twisted.

In case that the bus bars 2 are aligned and arranged in the width direction like the electric current sensors 21, 71 shown in FIGS. 2, 7, if the frequency of the electric current flowing through the bus bars 2 becomes high, the following two effects appear, namely one is a skin effect that an electric current distribution concentrates on the surface part and another is a proximity effect that the electric currents adjacent to each other repel each other, thereby a complicated behavior is shown, so as to cause an error.

The electric current sensor 81 according to the third embodiment is configured such that the bus bars 2 are aligned and arranged in the thickness direction in the parts in which the electric current is detected, thus it becomes possible to keep the distance between the bus bars 2 at a large value, so as to suppress the proximity effect. As a result, even if the frequency of the electric current flowing through the bus bars 2 is high, it becomes possible to highly maintain the detection accuracy.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. An electric current sensor, comprising:
   a plurality of bus bars arranged in parallel;
   a plurality of magnetic detection elements that are provided such that a number thereof is not less than a number of the bus bars, and that are adapted to detect a strength of a magnetic field generated by an electric current flowing through the bus bars and to output a voltage according to the strength of the magnetic field detected; and
   an arithmetic operation part to arithmetically operate an electric current flowing through each of the bus bars based on the voltage output from the plurality of magnetic detection elements,
   wherein at least one of the bus bars is provided with a through hole that penetrates the one of the bus bars,
   wherein an electric current path is formed on both sides of the through hole,
   wherein at least one of the magnetic detection elements is arranged in the through hole so as to detect a strength of a synthetic magnetic field obtained by synthesizing a magnetic field generated due to an electric current flowing through the electric current path formed on the both sides of the through hole,
   wherein the magnetic detection element arranged in the through hole is arranged at a position in which the strength of the synthetic magnetic field is zero,
   wherein the arithmetic operation part comprises a magnetic flux density arithmetic operation part to arithmetically operate a magnetic flux density based on the voltage output from the plurality of magnetic detection elements, and an electric current arithmetic operation part to arithmetically operate an electric current $I_1$ to $I_m$ flowing through each of the bus bars based on formula (1) below, $$\begin{cases} B_1 = a_{11} \cdot I_1 + a_{12} \cdot I_2 + \ldots + a_{1n} \cdot I_n \\ B_2 = a_{21} \cdot I_1 + a_{22} \cdot I_2 + \ldots + a_{2n} \cdot I_n \\ B_3 = a_{31} \cdot I_1 + a_{32} \cdot I_2 + \ldots + a_{3n} \cdot I_n \\ \vdots \qquad \qquad \vdots \\ B_m = a_{m1} \cdot I_1 + a_{m2} \cdot I_2 + \ldots + a_{mn} \cdot I_n \end{cases} \quad (1)$$

where
$a_{11}$ to $a_{mn}$ are coefficients, $B_1$ to $B_m$ are a magnetic flux density of the respective magnetic detection elements calculated by the magnetic flux density arithmetic operation part and $I_1$ to $I_m$ are an electric current flowing through the respective bus bars.

2. The electric current sensor according to claim 1, wherein the bus bars comprise three bus bars to flow therethrough an electric current of each phase of a three-phase alternating current,
   wherein the bus bars are aligned and arranged apart from each other in a width direction so as to be parallel to each other in a longitudinal direction thereof,
   wherein the through hole is formed in the bus bars arranged on both sides in the alignment direction, corresponding one of the magnetic detection elements being arranged in the through hole, and
   wherein the magnetic detection elements are arranged on at least one side of the three bus bars.

3. The electric current sensor according to claim 2, wherein the plurality of the magnetic detection elements are mounted on a single circuit substrate.

4. The electric current sensor according to claim 1, wherein the plurality of bus bars are aligned and arranged apart from each other in the thickness direction so as to be parallel to each other in a longitudinal direction thereof, and
   wherein the through hole is formed in the plurality of the bus bars and the magnetic detection elements are each correspondingly arranged in the through hole.

5. The electric current sensor according to claim 1, wherein the magnetic detection elements comprise a GMR sensor.

6. The electric current sensor according to claim 1, further comprising a temperature sensor configured to measure a temperature of the circuit substrate mounting the magnetic detection elements,
   wherein the magnetic flux density arithmetic operation part of the arithmetic operation part is adapted to make a correction based on the temperature measured by the temperature sensor when arithmetically operating the magnetic flux density based on the voltage output from the plurality of the magnetic detection elements.

7. The electric current sensor according to claim 1, wherein the arithmetic operation part further comprises an element abnormality determination part to monitor the voltage output from the magnetic detection elements so as to output an abnormal signal when the voltage is not less than a preset upper limit threshold value or not more than a preset lower limit threshold value.

8. The electric current sensor according to claim 1, wherein the bus bars comprise three bus bars to flow therethrough an electric current of each phase of a three-phase alternating current, and wherein the arithmetic operation part further comprises an electric current abnormality determination part to monitor the electric current calculated by the electric current arithmetic operation part so as to output an abnormal signal when the electric current flowing through the bus bars is not a three-phase alternating current.

\* \* \* \* \*